Figure 1:
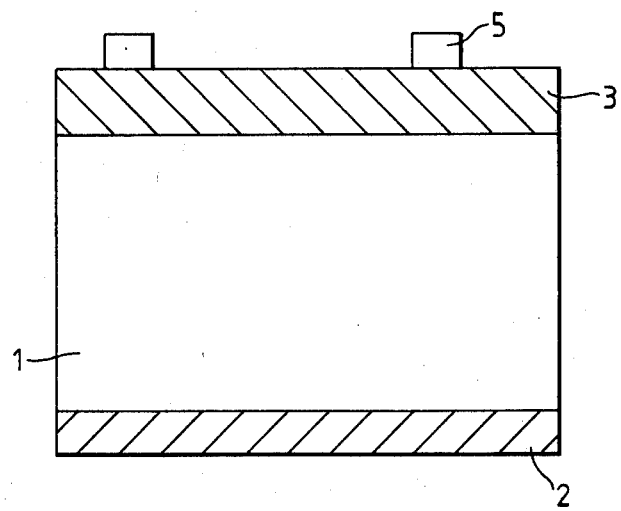

United States Patent [19]

Green et al.

[11] 4,404,422

[45] Sep. 13, 1983

[54] HIGH EFFICIENCY SOLAR CELL STRUCTURE

[75] Inventors: Martin A. Green, Sydney; Andrew W. Blakers, Campbell, both of Australia

[73] Assignee: Unisearch Limited, Kensington, Australia

[21] Appl. No.: 302,650

[22] Filed: Sep. 15, 1981

[30] Foreign Application Priority Data

Sep. 26, 1980 [AU] Australia ............................. 5773/80

[51] Int. Cl.³ ...................... H01L 31/06; H01L 31/18
[52] U.S. Cl. ..................................... 136/255; 29/572; 357/30; 427/74
[58] Field of Search ....................... 136/255, 258 AM; 357/30; 29/572; 427/74

[56] References Cited

U.S. PATENT DOCUMENTS

| | | | |
|---|---|---|---|
| 3,457,470 | 7/1969 | Meuleman | 357/29 |
| 4,144,094 | 3/1979 | Coleman et al. | 136/256 |
| 4,200,473 | 4/1980 | Carlson | 136/255 |
| 4,251,286 | 2/1981 | Barnett | 136/260 |
| 4,253,881 | 3/1981 | Hezel | 136/256 |
| 4,343,962 | 8/1982 | Neugroschel et al. | 136/255 |

FOREIGN PATENT DOCUMENTS 2230086  1/1975  France ............................... 136/255

OTHER PUBLICATIONS

M. A. Green et al., "The MINP Solar Cell–A New High Voltage, High Efficiency Silicon Solar Cell", *Conf. Record, 15th IEEE Photovoltaic Specialists Conf.* (1981), pp. 1405–1408.

*Primary Examiner*—Aaron Weisstuch

[57] ABSTRACT

The invention relates to a new-type of solar cell structure, and to a method of manufacturing same. The solar cell is designated as an MINP cell (Metal-Insulator-NP junction solar cell). Essentially, the MINP solar cell is an extremely shallow N-P junction cell with a MIS (Metal-Insulator-Semiconductor) type contact made to the top of the cell. Although combining features of the two technologies, no more processing steps are required than for a conventional P-N junction cell. The advantage of the MINP structure is its substantially improved efficiency.

8 Claims, 4 Drawing Figures

HIGH EFFICIENCY SOLAR CELL STRUCTURE

The present invention relates to a method forming a high efficiency solar cell structure. The invention further relates to the novel solar cell structure per se.

A solar cell converts sunlight directly to electricity using the photovoltaic effect in a semiconductor. When illuminated, a solar cell is capable of supplying current to an electrical load connected across its terminals. Maximum current output is obtained when the cell is short-circuited and is known as the short circuit current ($I_{SC}$). Maximum voltage output is obtained when the cell is open circuited. This is known as the open circuit voltage ($V_{OC}$). Maximum electrical power output is always less than the product of $V_{OC}$ and $I_{SC}$. The maximum power output is often expressed as the product of these two parameters multiplied by a factor less than unity known as the fill factor (FF). The fill factor for a well designed solar cell is relatively independent of material and cell structure, generally laying in the range 0.7 to 0.82. The efficiency of the cell is the ratio of electrical power output to the power in the incident sunlight.

It is an object of this invention to provide a solar cell structure which demonstrates a high efficiency in converting sunlight or other source of ionising radiation to electrical energy.

According to one aspect of the present invention there is provided a solar cell comprising a wafer of semiconductor substrate material having top and bottom metal contact layers having at least some contact with said substrate either directly or indirectly through an insulating layer, said substrate having two regions of different dopant type, i.e., a lower region of one dopant type in contact with the bottom metal contact layer and an upper region of different dopant type to that of said lower region and which is separated from said top metal contact layer by a thin insulating layer.

According to another aspect of the present invention there is provided a method of manufacturing a solar cell wherein a layer of one dopant type is applied to semiconductor substrate of a different dopant type to form a junction therebetween, depositing a bottom metal contact layer on said cell, forming a thin oxide layer on the top of said cell and depositing a top metal contact layer on said oxide layer.

Figure 2:
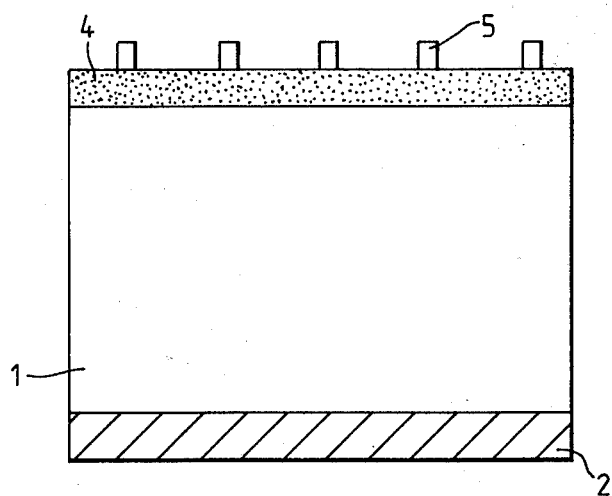
Figure 3:
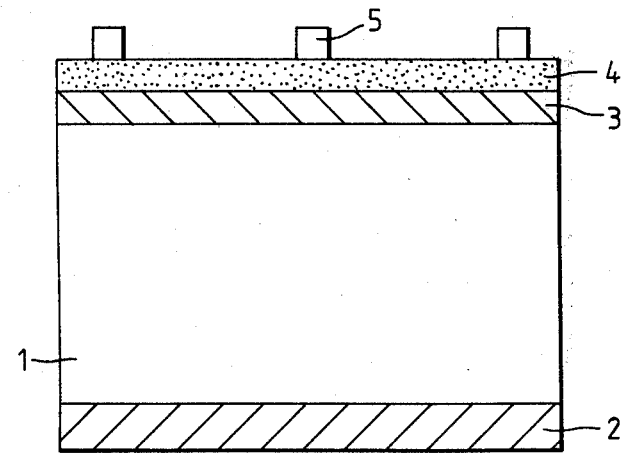
Figure 4:
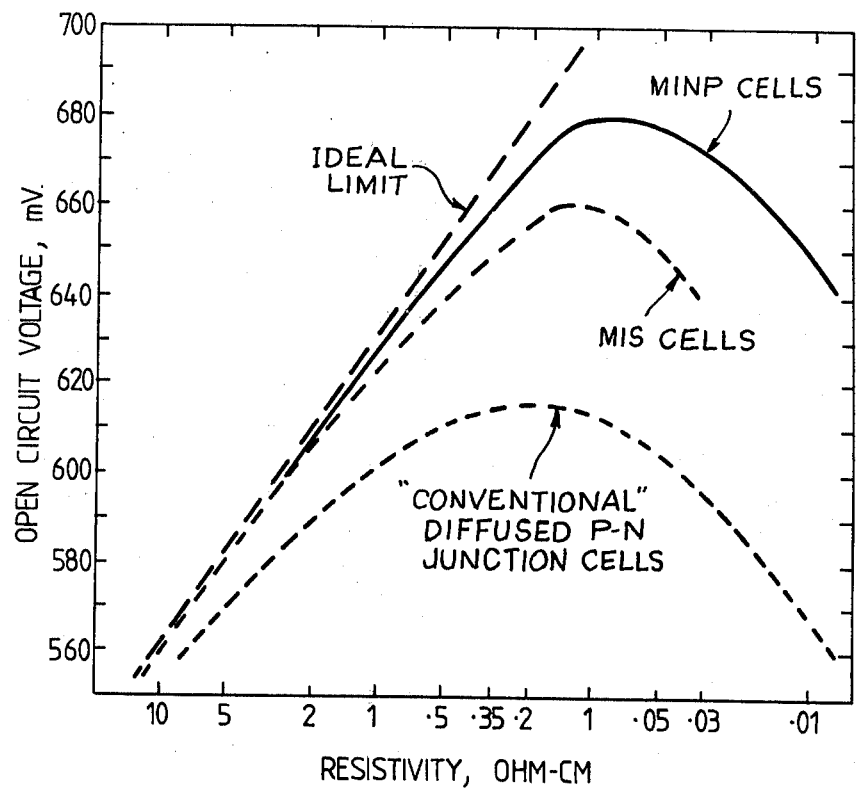

The invention will be further described with reference to the drawings, in which:

FIG. 1 schematically illustrates a typical P-N junction cell structure;

FIG. 2 schematically illustrates a typical MIS cell structure;

FIG. 3 schematically illustrates the MINP cell structure according to the present invention; and FIG. 4 illustrates graphically the maximum measured open circuit voltages versus substrate resistivity for MINP and MIS silicon solar cells. Also shown is the corresponding curve for conventional diffused N+P cells derived from several sources.

Referring to FIGS. 1 to 3, the cell structures comprise a silicon substrate of one dopant type 1 with a layer 3 of different dopant type (not FIG. 2), a thin insulating layer 4 (not FIG. 1), a bottom metal contact layer 2 and top metal grid contacts 5.

FIG. 4 compares the maximum observed open circuit voltages for MINP and MIS cells, as well as the values for "conventional" diffused P-N junction cells, and the ideal limit for all these cell types, based on simple diffusion theory.

Both MINP and MIS cells give voltages closer to the limit than diffused P-N junction cells, with the MINP cell giving a recorded voltage of 678 mV which—at the date of this application appears to be perhaps the highest value measured for any silicon cell by a large margin. The voltages recorded by the inventor have been substantiated by the Solar Energy Research Institute (SERI), Colorado, United States of America.

The most common solar cell structure to date utilizes a junction between two regions of semiconductor. These two regions differ in that each has a different class of dopant impurity dominant within it. The dominant dopant impurity imparts electronic properties known as P-type or N-type. This type of cell is commonly called a P-N junction cell and a typical example is illustrated in FIG. 1. Metallic contact is made to each of the N-type and P-type regions. For the typical example of FIG. 1, the contact to the side of the cell to be exposed to sunlight has an intermittent grid structure to let the light into the bulk of the cell.

A second type of cell recently shown to have some performance advantage over the P-N junction cell is the Metal-Insulator-Semiconductor (MIS) grating cell. In this device, a thin (<30 Å) insulating layer is grown or deposited on top of the semiconductor substrate. While electrical contact is made to the bottom of substrate in a similar manner to the P-N junction cell as indicated in FIG. 2, the situation with the top contact is different. In the configuration shown in FIG. 2, the top metal contact again has a grid-like structure as for P-N junction cells but in the MIS cell case has to serve two functions. Not only does it serve as an electrical contact, but is also serves as a rectifying junction eliminating the need for the P-N junction. However, it does have more stringent requirements placed on it. It has to have an extreme effective value of work function. A low effective work function is required for P-type substrates and a high effective work function for N-type substrates. Also in the configuration of FIG. 2, the spacing between the top grid contact fingers must be much smaller than in the P-N junction case. The structure has been shown to be more sensitive to the electrostatic environment than P-N junction cells, which is a disadvantage. However, it has demonstrated a significant performance advantage.

The present invention will be described in relation to each of the previous two structures. It includes elements of both of these, producing a device with performance superior to either. The structure is shown in FIG. 3. It incorporates a P-N junction similar to a P-N junction cell. However use of the new structure relaxes requirements on the P-N junction particularly in relation to the minimum number of dopant impurities required in the thinner of the junction regions. On top of the thinner of these regions is incorporated a Metal-Insulator-Semiconductor device. The effective work function of the metal used should be low if the thinner of the junction regions has N-type properties and high if it has P-type properties. However, the work function of this layer need not be as extreme as in the MIS case nor need the grid lines be as fine. The device which will be referred to as the MINP (Metal-Insulator-NP junction) solar cell does not display the same electrostatic sensitivity as the MIS grating cell while displaying a performance advantage over both this type of cell and P-N junction cells in specific implementations.

The performance advantage over P-N junction cells is attributed to better control of the electronic properties of the thinner of the junction regions because of the relaxed constraints on this region previously mentioned. For the same reason, surface recombination velocities along the surface between top contact lines can be better controlled. In addition, since an MIS top contact is used, the effective recombination velocity under the top contact can be kept much lower than in normal P-N junctions. The performance advantage over MIS grating cells results from the better control of effective recombination velocities right along the surface made possible by the presence of the thin doped region near the surface. In both of the above cases, the improved performance comes about primarily by increases in the open-circuit voltage of the cells. By virtue of their high voltages, they are far better than conventional silicon cells, and in some embodiments the performance has approached that of more exotic gallium arsenide cells.

Although the MINP structure appears more complex than a P-N junction cell, it actually involves no more effort to fabricate. It actually reduces processing times in some sections of the processing sequence.

P-N junction solar cells are normally manufactured by starting with a semiconductor substrate previously doped with one type of dopant impurity, either an N-type on a P-type dopant. The second type of dopant is then introduced in a thin layer near the surface either by diffusion at high temperature or by implanting high energy ions of the species and annealing at moderate temperatures. This forms the P-N junction. An alternative approach is to expitaxially grow a thin layer of semiconductor onto the substrate, ensuring that it incorporates the desired impurity. Additional major processing steps are the deposition of metal contacts to both sections of the junction, and in some cases, the deposition of an antireflection coating to reduce reflection losses from the top of the cell.

A preferred method of fabricating an MINP solar cell is to use the same sequence as normally used for forming the P-N junction. However, the thin layer near the surface need not be as thick or as heavily doped as required for P-N junction cells. This can reduce processing time for this stage significantly, particularly when ion implantation is used. After junction formation, cells can be cleaned if required and a back contact deposited. A thin thermal oxide (approximately 20 Å thick) is then grown over the top of the cell during a processing step in which this back contact is sintered. The top contact is then deposited. Vacuum deposition through a metal mask has been found to be a suitable process for this deposition although other techniques are possible. An antireflection coating is then deposited and the device can then be sintered at low temperature.

Prototypes have been fabricated using this preferred processing sequence and the most common semiconductor used for solar cell work is silicon. Starting with boron doped P-type silicon single crystal substrates, a thin layer with N-type properties was formed at the surface of the silicon either by high temperature diffusion of phosphorus using a $POCl_3$ source or by implantation of phosphorus ions. The total number of phosphorus dopants introduced was kept less than with processing for conventional P-N junction cells. The implanted cells were given heat treatments to remove radiation damage and activate the implanted ions. After chemical cleaning, an aluminum back contact was deposited by vacuum evaporation and the devices sintered at 550° C. This step improves electrical contact as well as forming the thin oxide layer with desired properties. A layer of metal with a low work function (e.g. Al, Ti, Mg.) was then deposited on the top of the cell through a metal mask to define the top contact grid. Finally a silicon monoxide antireflection coating was deposited. After fabrication in this way, High Resolution Electron Microscopy can detect a thin oxide layer of about 20 Angstroms thickness between the top metal contact and the silicon.

Other suitable low function metals for the top contact include Hf, Zr, In, Y, Mn, Sc, Ca, many rare earth metals and some transuranics. The top metal contact could also be a material with metallic properties such as degenerately doped semiconductors.

Devices fabricated in this way have exhibited exceptionally good performance. Although further optimisation is possible and further performance improvements expected, recent embodiments of the MINP devices have given open circuit voltages as high as 678 mV under standard test conditions (Air Mass Zero sunlight, 25° C.). This is the highest value ever reported for a single- or polycrystalline silicon solar cell. This advantage in open circuit voltage translates directly into an energy conversion efficiency as described earlier. Energy conversion efficiencies of 16% have been independently measured for our cells under Air Mass One Illumination.

Although the invention has been described above with reference to preferred embodiments and drawings, it will be appreciated that numerous variations, modifications or alternatives may be substituted for specifically described features, without departing from the spirit or scope of the invention as broadly described.

What I claim:

1. A solar cell comprising a body of semiconductor material having top and bottom metal contact layers, said body having two regions of different conductivity type forming a junction therebetween, namely a lower region containing a dopant of one conductivity type in contact with the bottom metal contact layer and an upper region containing a dopant of opposite conductivity type, said upper region being separated from said top metal contact layer by a thin insulating layer, said top metal contact being configured to allow the passage of incident radiation.

2. A solar cell according to claim 1 wherein the lower region of said body is doped with a P-type impurity and said upper region is doped with a N-type impurity.

3. A solar cell according to claim 1 wherein the lower region of said body is doped with an N-type impurity and said upper region is doped with a P-type impurity.

4. A solar cell according to claim 1 wherein said top metal contact layer is comprised of a metal selected from the group consisting of Al, Ti, Mg, Hf, Zr, In, Y, Mn, Sc and Ca.

5. A solar cell according to claim 1 further comprising a top antireflection coating.

6. A method of manufacturing a solar cell comprising the steps of forming a layer of semiconductor material containing a dopant of one conductivity type on top of a layer of semiconductor material containing a dopant of opposite conductivity type to form a junction therebetween, depositing a bottom metal contact layer on one of said layers, forming a thin oxide layer on the other of said layers and depositing a top metal contact layer configured to allow the passage of incident radiation on said oxide layer.

7. A method according to claim 6 further comprising the addition of an antireflection coating to the top of said cell.

8. A solar cell prepared by a method according to claim 6.

* * * * *